United States Patent
Chang et al.

(10) Patent No.: US 10,636,829 B1
(45) Date of Patent: Apr. 28, 2020

(54) WAFER-LEVEL OPTICAL STRUCTURE

(71) Applicant: HIMAX TECHNOLOGIES LIMITED, Tainan (TW)

(72) Inventors: Chih-Sheng Chang, Tainan (TW); Teng-Te Huang, Tainan (TW); Shu-Hao Hsu, Tainan (TW); Jun-Yu Zhan, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/170,021

(22) Filed: Oct. 24, 2018

(51) Int. Cl.
*H01L 31/062* (2012.01)
*H01L 27/146* (2006.01)
*H04N 5/225* (2006.01)
*C09J 5/08* (2006.01)

(52) U.S. Cl.
CPC .......... *H01L 27/14632* (2013.01); *C09J 5/08* (2013.01); *H01L 27/14627* (2013.01); *H01L 27/14687* (2013.01); *H04N 5/2254* (2013.01)

(58) Field of Classification Search
CPC ............. H01L 27/146; H01L 26/14627; H01L 27/14632; H01L 27/14687
See application file for complete search history.

(56) References Cited

U.S. PATENT DOCUMENTS

| 6,429,105 | B1 | 8/2002 | Kunikiyo | |
|---|---|---|---|---|
| 7,682,934 | B2 | 3/2010 | Chen | |
| 2010/0123260 | A1* | 5/2010 | Duparre | B29D 11/00365 264/1.38 |
| 2011/0204531 | A1* | 8/2011 | Hara | B29C 41/36 264/1.36 |
| 2015/0115413 | A1* | 4/2015 | Rudmann | H01L 27/14618 257/622 |

FOREIGN PATENT DOCUMENTS

| CN | 103489885 B | 5/2016 |
|---|---|---|
| TW | 201316502 A1 | 4/2013 |
| WO | 2010/072826 A2 | 7/2010 |

* cited by examiner

*Primary Examiner* — Phuc T Dang
(74) *Attorney, Agent, or Firm* — Winston Hsu

(57) ABSTRACT

A wafer-level optical structure includes at least two optical lens sets disposed on an optically transparent wafer, at least one trench disposed between two adjacent optical lens sets to divide the two adjacent optical lens sets, at least one spacer disposed between two adjacent optical lens sets to be correspondingly and partially disposed in the trench, and an adhesive disposed inside the trench.

10 Claims, 13 Drawing Sheets

WAFER-LEVEL OPTICAL STRUCTURE

BACKGROUND OF THE INVENTION

1. Field of the Invention

The present invention generally relates to a wafer-level optical structure as well as to a method to form a wafer-level optical structure. In particular, the present invention is directed to a wafer-level optical structure which is free of an over-flow problem or free of an over-glue issue to overcome some problems in prior art. The present invention is also directed to a method to form a wafer-level optical structure in the absence of the over-flow problem or of the over-glue issue to overcome the current problems in prior art.

2. Description of the Prior Art

In addition to fabricate optical lens sets which are required to be assembled individually from a multitude of individual parts, it is also possible to fabricate a large area of optical lens sets at the same time on an optical glass wafer alternatively in accordance with the conventional semiconductor manufacture process. This top-tier technology is known as "wafer-level" optical lens sets. For example, this kind of optical lens sets may be used in a 3D sensor.

The wafer-level fabrication and integration of multiple micro-optical components are a promising alternative solution which assembles a CMOS image sensor, multiple polymeric lenses molded onto a glass wafer, multiple spacers to segregate the multiple polymeric lenses and a cover layer together. When spacers are attached to the lens layer to be fixed on the lens layer, an adhesive is usually needed to help spacers firmly fixed on the lens layer. For this purpose, a soft, liquid-like adhesive is typically used to make the spacers firmly attached to the lens layer.

When the soft, liquid-like adhesive is squeezed by the spacers after the soft, liquid-like adhesive is first applied to the lens layer, it would induce a severe problem. Due to the top-down pressure, the soft, liquid-like adhesive overflows to the neighbor region to cause over-glue issue and simultaneously contaminates the neighbor region. A wafer-level optical structure with the over-flow problem or with the over-glue issue apparently shows bad optical quality.

Given the above, it is still needed to propose a novel method to form a wafer-level optical structure to be free of the over-flow problem or free of the over-glue issue to overcome the above problems in prior art.

SUMMARY OF THE INVENTION

In the light of the problems in prior art, the present invention proposes a novel wafer-level optical structure as well as a novel method to form a wafer-level optical structure with the help of a trench to overcome the above problems in prior art. Because the novel method to form a wafer-level optical structure of the present invention employs a trench to accommodate the adhesive for fixing the spacers, the accommodated adhesive shows no over-flow problem or no over-glue issue to construct a better lens profile and to obtain a better yield rate.

Accordingly, the present invention in a first aspect provides a novel method to form a wafer-level optical structure in the presence of a trench to overcome the above problems in prior art. First, an optically transparent wafer is provided. The optically transparent wafer has a residual layer which is disposed on the optically transparent wafer and has at least two lenses which are disposed on the residual layer. Each one of the lens is integrated with the residual layer. Second, the residual layer which is disposed between two adjacent lenses is partially removed to simultaneously form at least one trench and to form at least two optical lens sets. Each one of the at least two optical lens sets includes one lens which is integrated with the residual layer. Then, the trench is filled with an adhesive material. Next, the trench is provided with a spacer so that the spacer is partially accommodated in one corresponding trench to divide two adjacent optical lens sets. Afterwards, a curing step is carried out to cure the adhesive material which is accommodated inside the trench to form an adhesive to permanently fix the spacer on the optically transparent wafer.

In one embodiment of the method to form a wafer-level optical structure of the present invention, a laser treatment is used to remove the residual layer.

In another embodiment of the method to form a wafer-level optical structure of the present invention, the trench may expose the underlying optically transparent wafer.

In another embodiment of the method to form a wafer-level optical structure of the present invention, the adhesive is selected from a group consisting of a UV curable adhesive, a thermal curable adhesive and a pressure sensitive adhesive (PSA).

In another embodiment of the method to form a wafer-level optical structure of the present invention, removing the residual layer simultaneously forms an extending shoulder and the extending shoulder is attached to one of the at least two optical lens sets which is adjacent to the extending shoulder.

In another embodiment of the method to form a wafer-level optical structure of the present invention, the spacer is not indirect contact with the extending shoulder.

In another embodiment of the method to form a wafer-level optical structure of the present invention, the method to form a wafer-level optical structure further includes the following steps. First, the adhesive material is applied to the top surface of each one of the spacers. Second, an optically transparent substrate is provided. The optically transparent substrate is disposed on the top surface of the spacers. Then a spacer curing step is carried out to cure the adhesive material which is disposed between the spacers and the optically transparent substrate to become the adhesive.

In another embodiment of the method to form a wafer-level optical structure of the present invention, there are at least two imaging optical lens sets disposed on the optically transparent substrate and respectively corresponding to the at least two optical lens sets.

In another embodiment of the method to form a wafer-level optical structure of the present invention, there are at least two bottom optical lens sets disposed on the optically transparent wafer, located beneath the at least two optical lens sets and respectively corresponding to the at least two optical lens sets.

The present invention in a second aspect proposes another novel method to form a wafer-level optical structure. First, an optically transparent wafer is provided. The optically transparent wafer has a residual layer disposed on the optically transparent wafer and at least two lenses disposed on the residual layer. Each one of the at least two lenses is integrated with the residual layer. Second, the residual layer disposed between two adjacent lenses is partially removed to form at least one trench and to form at least two optical lens sets. Each one of the at least two optical lens sets includes one lens integrated with the residual layer. Next, the trench is filled with an adhesive material. Then, an optically transparent substrate is provided. The optically transparent substrate has at least one spacer. Afterwards, the optically transparent substrate is combined with the optically transparent wafer so that the spacer is in direct contact with the adhesive material, disposed between two adjacent optical lens sets and correspondingly and partially accommodated in the trench to divide the two adjacent optical lens sets. Subsequently, a curing step is carried out to cure the adhesive material to become an adhesive in order to permanently fix the spacer on the optically transparent wafer.

The present invention in a third aspect proposes a novel wafer-level optical structure. The wafer-level optical structure of the present invention includes an optically transparent wafer, at least two optical lens sets, at least one trench, at least one spacer, and an adhesive. The at least two optical lens sets are disposed on the optically transparent wafer. Each one of the at least two optical lens sets includes a lens integrated with a residual layer. The trench is disposed above the optically transparent wafer and between two adjacent optical lens sets to divide the adjacent two optical lens sets. The spacer is disposed on the optically transparent wafer, disposed between the two adjacent optical lens sets and correspondingly and partially disposed in the trench. The adhesive is disposed inside the trench and in direct contact with the spacer.

In one embodiment of the wafer-level optical structure of the present invention, each one of the at least two optical lens sets further includes an extending shoulder which is not in contact with an adjacent spacer.

In another embodiment of the wafer-level optical structure of the present invention, two of the adjacent extending shoulders define the trench.

In another embodiment of the wafer-level optical structure of the present invention, the adhesive is in direct contact with the extending shoulder.

In another embodiment of the wafer-level optical structure of the present invention, the adhesive is in direct contact with the optically transparent wafer.

In another embodiment of the wafer-level optical structure of the present invention, there are multiple trenches and the trenches have variable width.

In another embodiment of the wafer-level optical structure of the present invention, the wafer-level optical structure further includes an optically transparent substrate which is disposed on the spacer.

In another embodiment of the wafer-level optical structure of the present invention, the optically transparent substrate is attached to the spacer with the help of the adhesive.

In another embodiment of the wafer-level optical structure of the present invention, the wafer-level optical structure further includes at least two imaging optical lens sets which are disposed on the optically transparent substrate and respectively correspond to the at least two optical lens sets.

In another embodiment of the wafer-level optical structure of the present invention, the wafer-level optical structure further includes at least two bottom optical lens sets which are disposed on the optically transparent wafer, located beneath the at least two optical lens sets and respectively correspond to the at least two optical lens sets.

The novel method to form a wafer-level optical structure of the present invention forms a trench to accommodate the spacer which supports the optically transparent substrate and to accommodate the soft adhesive material which is used to permanently fix the spacer. In such a way, the soft, liquid-like adhesive material before curing is well accommodated inside the trench so the over-flow problem or the over-glue issue can be greatly improved or completely solved.

Further, the adhesive material may be cured in the absence of a thermal treatment to eliminate an undesirable bow distortion of the optically transparent wafer along with the polymeric layer and the undesirable misalignment of stack layers to overcome the misalignment problems in prior art. Accordingly, the obtained novel wafer-level optical structure has neither undesirable bow distortion, neither undesirable misalignment of stack layers, nor undesirable over-flow problem and over-glue issue to show better product quality and optimal optical performance.

These and other objectives of the present invention will no doubt become obvious to those of ordinary skill in the art after reading the following detailed description of the preferred embodiment that is illustrated in the various figures and drawings.

DETAILED DESCRIPTION

To eliminate undesirable bow distortion, undesirable misalignment of stack layers, or undesirable over-flow problem and over-glue issue, the present invention provides a novel method to form an optical structure on a wafer-level scale. The novel method of the present invention proposes a solution to accommodate the soft, liquid-like uncured adhesive material which is used to permanently fix the spacers to improve the over-flow problem and over-glue problem. Further, the adhesive material may be cured in the absence of a thermal treatment to eliminate the undesirable bow distortion of the optically transparent wafer along with the polymeric layer and the undesirable misalignment of stack layers to exhibit better product quality, interlayer alignment accuracy and optical performance.

FIG. 1 to FIG. 6 illustrate a first example of a novel method to form a wafer-level optical structure of the present invention. Please refer to FIG. 1. First, an optically transparent wafer 110 is provided. The optically transparent wafer 110 may be a glass wafer made of optically transparent material, such as glass or a silica material, for use as a carrier in an optical lens structure. Preferably speaking, the optically transparent material for the optically transparent wafer 110 may be glass with the coefficient of thermal expansion as small as possible. "Optically transparent" refers to a material which allows light of specific wavelength to pass through the material without substantially reducing the intensity of the light.

There are multiple optical lens sets 120 disposed on the optically transparent wafer 110. For example, there are at least two optical lens sets 120 disposed on and in direct contact with the optically transparent wafer 110. Preferably speaking, there are multiple optical lens sets 120 to form an array disposed on the optically transparent wafer 110.

Figure 1:
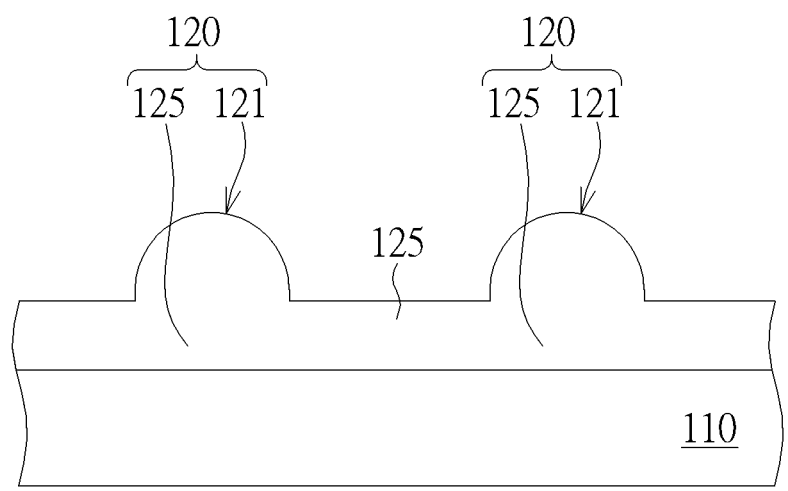
FIG. 1, FIG. 2, FIG. 3, FIG. 4, FIG. 5 and FIG. 6 illustrate a first example of a novel method to form a wafer-level optical structure of the present invention.

As shown in FIG. 1, the multiple optical lens sets 120 disposed on the optically transparent wafer 110 include multiple lenses 121 integrated with one residual layer 125. Each optical lens set 120 includes one single lens 121 integrated with the residual layer 125. The lenses 121 and the residual layer 125 are made of the same optically transparent material to serve as the optical lens sets 120. For example, the optically transparent material may be a polymeric material. The surface curvature of each lens 121 may be either convex or concave.

Preferably speaking, the polymeric material for the optical lens sets 120 may be an acrylate-type material or a methacrylate-type material. The lenses 121 and the residual layer 125 are integrally formed or one-piece formed so the lenses 121 and the residual layer 125 are integrated with one another and not separable. For example, the lenses 121 and the residual layer 125 may be formed by the polymerization of monomers or oligomers of an acrylate-type material or a methacrylate-type material in the presence of a template (not shown) to facilitate the formation of the surface curvature of each lens 121.

Figure 2:
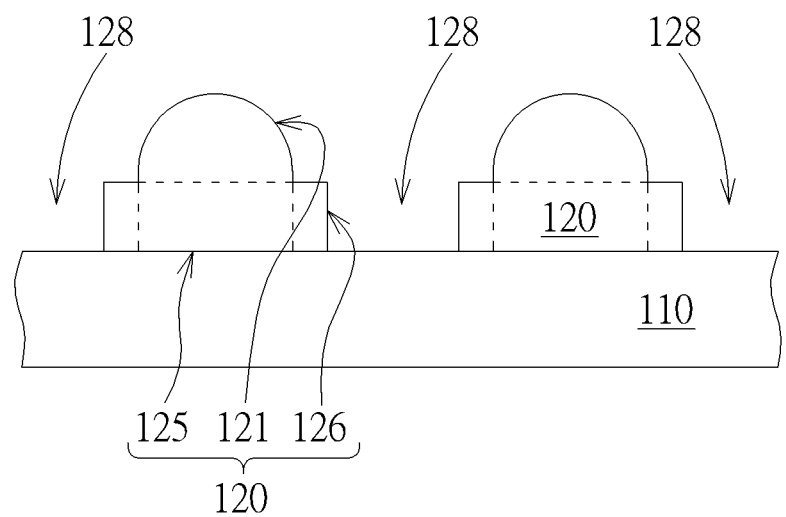

Second, please refer to FIG. 2, a removal step is carried out to remove the residual layer 125 which is directly disposed between two adjacent lenses 121. The removal step is used to divide the mutually connected multiple optical lens sets 120 to simultaneously form multiple individual optical lens sets 120 and multiple trenches 128. Each trench 128 is sandwiched between two adjacent individual optical lens sets 120 to segregate two adjacent optical lens sets 120. In particular, the residual layer 125 may be sufficiently or deeply removed so that the optically transparent wafer 110 underlying the trench 128 may be exposed or not exposed. In one embodiment of the present invention, there are multiple trenches 128 disposed on the optically transparent wafer 110 and the trenches 128 may have variable width or different width.

Figure 2A:
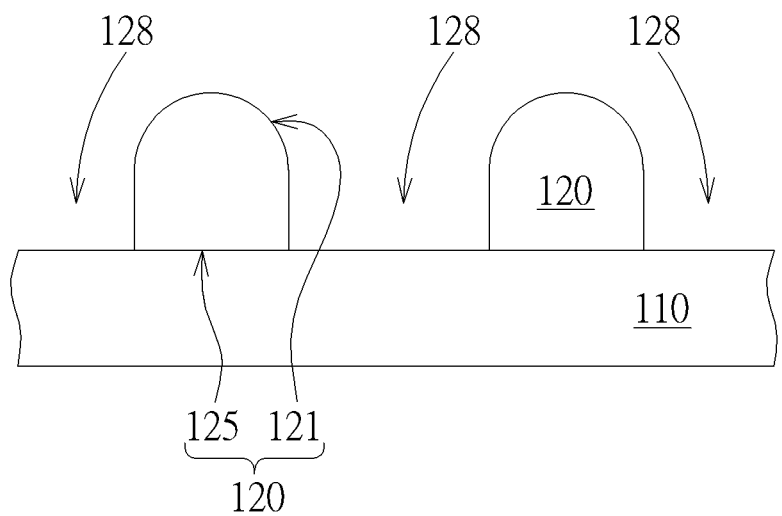
FIG. 2A illustrates that the optically transparent wafer underlying the trench is exposed in the absence of the shoulder.
Figure 2B:
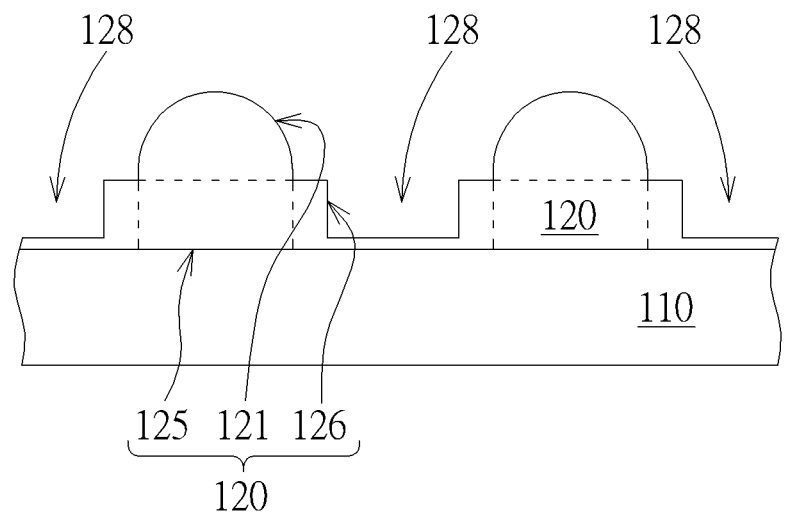
FIG. 2B illustrates that the optically transparent wafer underlying the trench is not exposed in the presence of the shoulder.
Figure 2C:
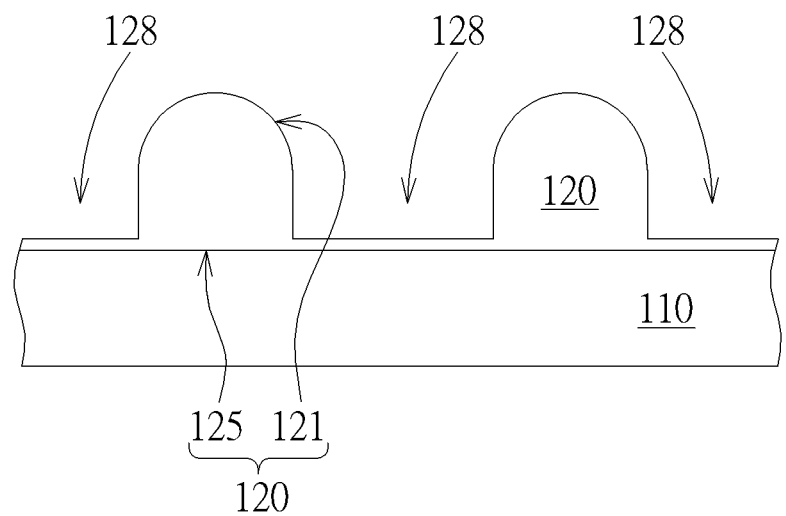
FIG. 2C illustrates that the optically transparent wafer underlying the trench is not exposed in the absence of the shoulder.

Laser may be used to carry out the removal step. For example, the removal step may be carried out to remove the residual layer 125 in the presence of laser. Preferably speaking, as shown in FIG. 2, the residual layer 125 is partially removed so that each optical lens set 120 has an extending shoulder 126. FIG. 2 illustrates that the optically transparent wafer 110 underlying the trench 128 is exposed in the presence of the shoulder 126, FIG. 2A illustrates that the optically transparent wafer 110 underlying the trench 128 is exposed in the absence of the shoulder 126 and FIG. 2B illustrates that the optically transparent wafer 110 underlying the trench 128 is not exposed in the presence of the shoulder 126, and FIG. 2C illustrates that the optically transparent wafer 110 underlying the trench 128 is not exposed in the absence of the shoulder 126.

For example, the residual layer 125 in each optical lens set 120 is wider than the lens 121 atop and the wider region of the residual layer 125 in each optical lens set 120 serves as the extending shoulder 126 of the optical lens set 120. Or alternatively, as shown in FIG. 2A, the residual layer 125 sandwiched between two adjacent individual optical lens set 120 is completely removed so that there is no shoulder in each optical lens set 120. A wider shoulder 126 makes the trench 128 narrower so multiple trenches 128 may have variable width or different width. After the removal step, each optical lens set 120 is isolated and not in contact with one another. Each individual optical lens set 120 includes one single lens 121 integrated with the residual layer 125, with or without an extending shoulder 126.

Figure 2D:
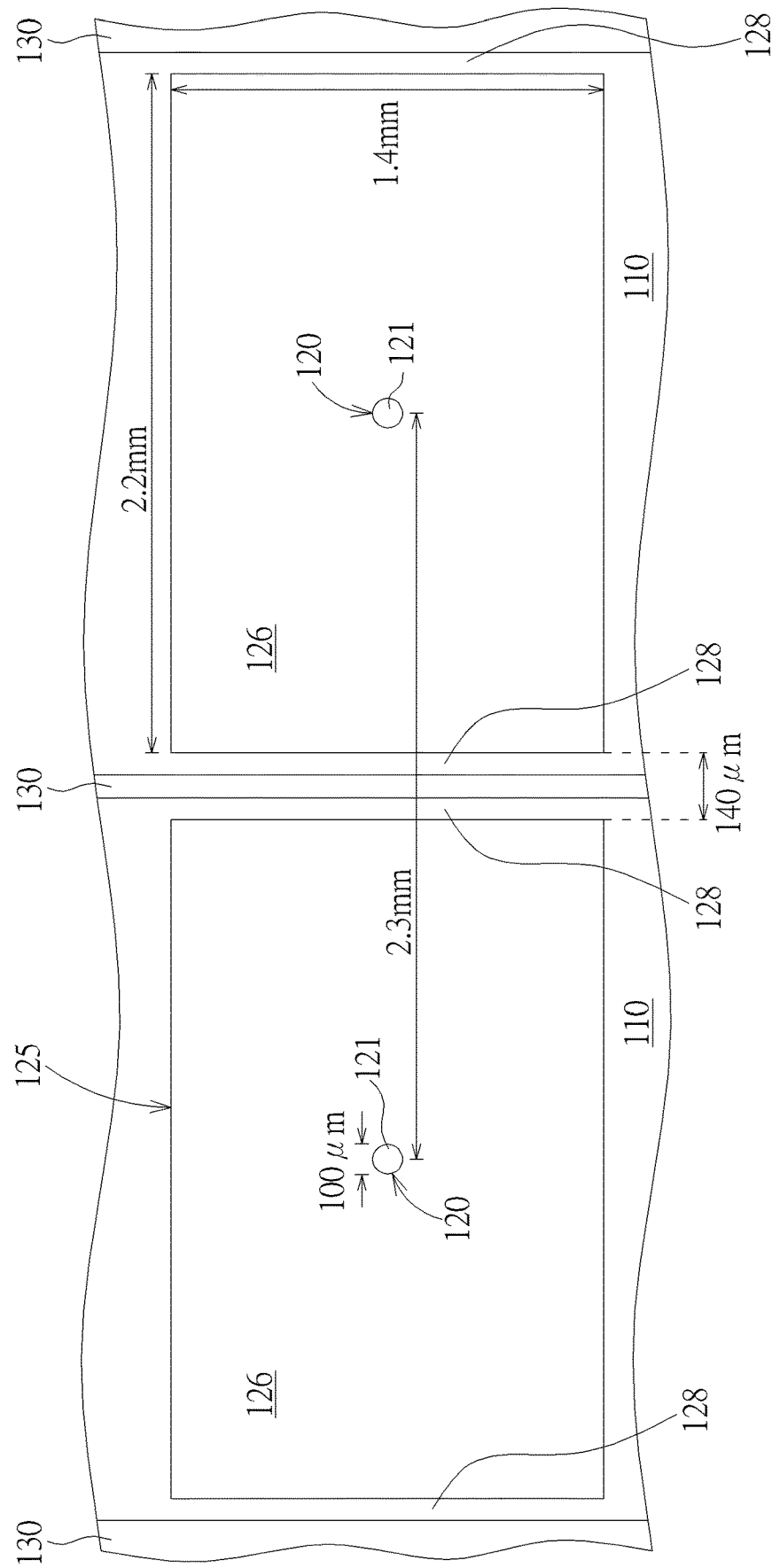
FIG. 2D illustrates a top view of FIG. 2.

FIG. 2D illustrates a top view of FIG. 2. The size of the trench 128 is dependent upon the sizes of the optical lens set 120. For example, the diameter of a lens 121 may be approximately 100 µm. The residual layer 125 with shoulders 126 of an optical lens set 120 may be in a shape of a rectangular with the dimensions of approximately 1.4 mm*2.2 mm. The pitch of two adjacent the optical lens sets 120 (from the center of one lens 121 to the center of another adjacent lens 121) is approximately 2.3 mm and the width of the trench 128 may be approximately 140 µm. However, the sizes of the above mentioned elements are not limited to the above described numeral values.

Figure 3:
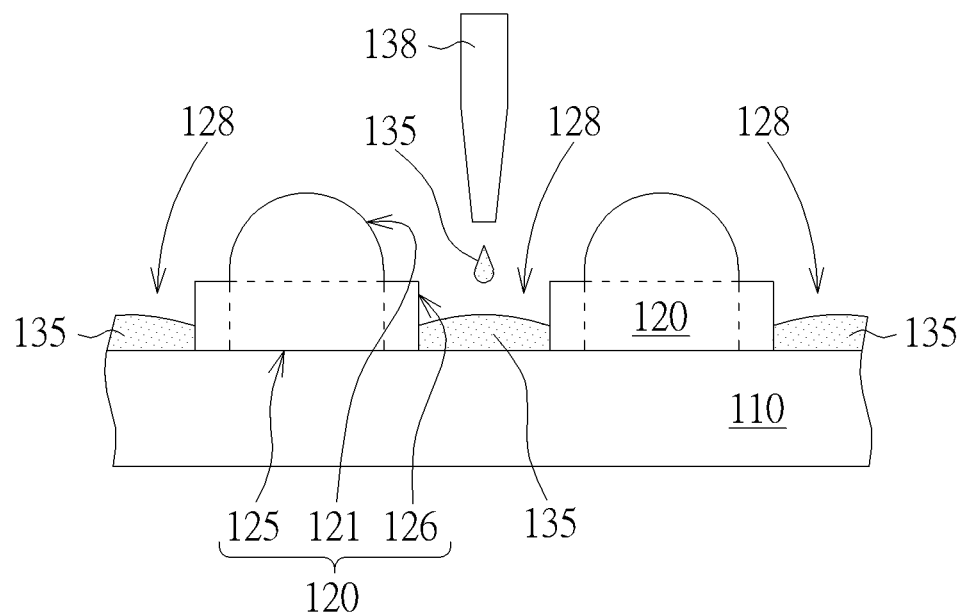

Next, please refer to FIG. 3, each trench 128 is filled with an adhesive material 135. The adhesive material 135 is usually a soft or a liquid-like glue. For example, the adhesive material 135 may be a curable adhesive material and selected from a group consisting of a UV curable adhesive, a thermal curable adhesive and a pressure sensitive adhesive (PSA). A UV curable adhesive may be cured by a suitable UV light exposure condition. A thermal curable adhesive may be cured by a suitable thermal treatment condition, and a pressure sensitive adhesive may be cured by a sufficiently pressure-applied condition. In FIG. 3, the soft, liquid-like adhesive material 135 is illustrated to be dispensed by a dispenser 138.

Figure 3A:
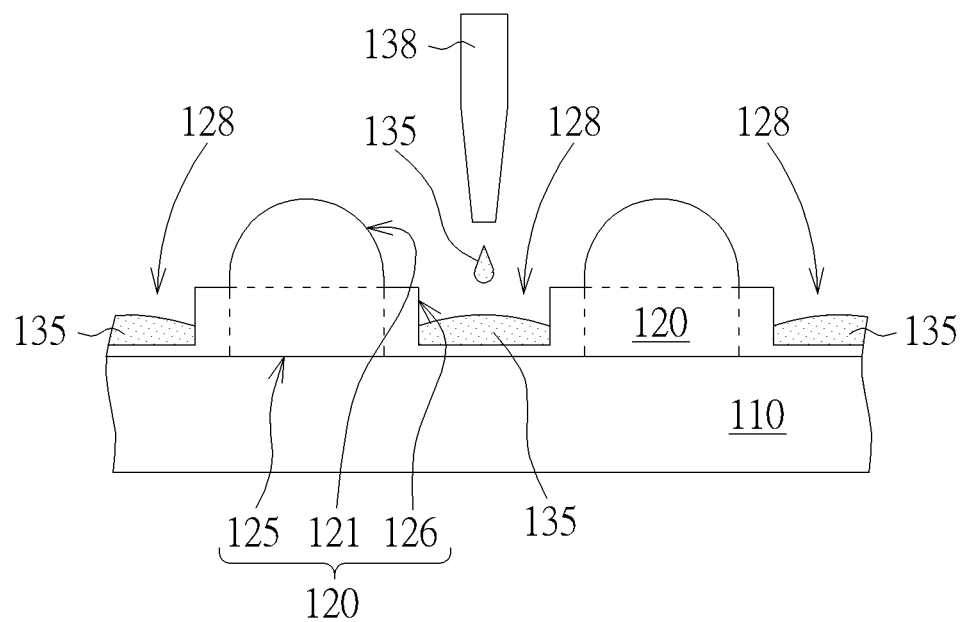
FIG. 3A illustrates that the optically transparent wafer underlying the trench is exposed in the absence of the shoulder.

Because each trench 128 is defined by the adjacent individual optical lens sets 120, the soft, liquid-like adhesive material 135 is well accommodated inside the trench 128 and does not over-flow, i.e. over-glue, to the neighbor region when the soft, liquid-like adhesive material 135 is dispensed to partially fill the trench 128. Preferably speaking, the soft, liquid-like adhesive material 135 may be applied to make the trench 128 approximately half-filled to more efficiently prevent the undesirable over-glue issue. FIG. 3 illustrates that the optically transparent wafer 110 underlying the trench 128 is exposed in the presence of the shoulder 126, and FIG. 3A illustrates that the optically transparent wafer 110 underlying the trench 128 is not exposed in the presence of the shoulder 126.

Figure 4:
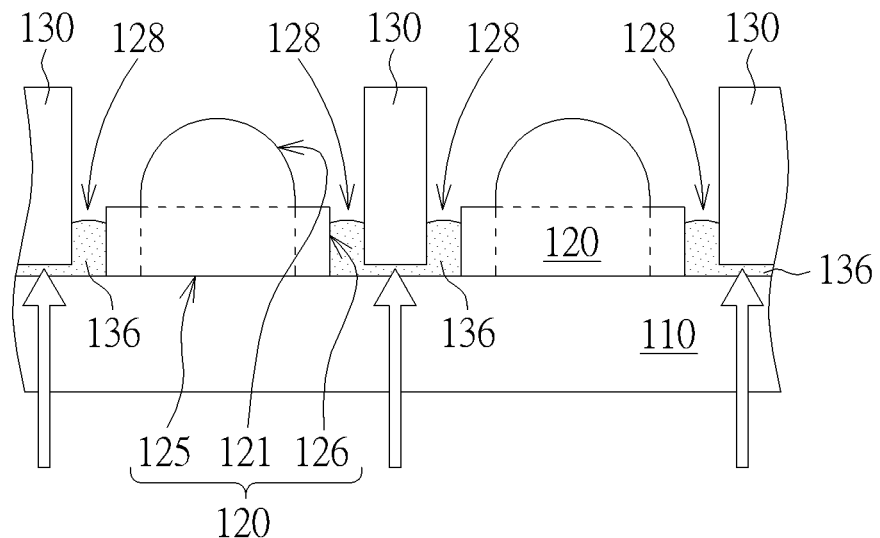

After each trench 128 is filled with enough adhesive material 135, please refer to FIG. 4, at least one spacer 130 is provided on the optically transparent wafer 110. Each spacer 130 is placed in a corresponding trench 128 so that each spacer 130 is partially disposed in the corresponding trench 128 and in direct contact with the adhesive material 135. In other words, each spacer 130 is disposed between two adjacent optical lens sets 120 to segregate two adjacent optical lens sets 120. In particular, each spacer 130 is not indirect contact with the optically transparent wafer 110 due to the adhesive material 135 sandwiched between the spacer 130 and the optically transparent wafer 110. Further, as shown in FIG. 4, the spacer 130 is also partially surrounded by the adhesive material 135.

Figure 4A:
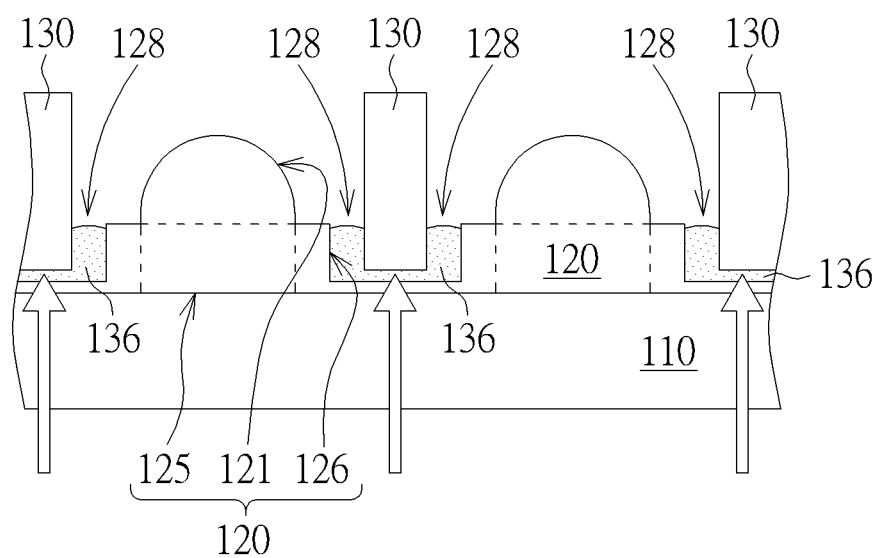
FIG. 4A illustrates that a spacer is provided between two optical lens sets and in a trench which does not expose the optically transparent wafer.

Preferably, with or without a shoulder 126, the spacer 130 is not in direct contact with any one of the optical lens sets 120. For example, the width of a spacer 130 is smaller than that of a trench 128. FIG. 4 illustrates that a spacer 130 is provided between two optical lens sets 120 and in a trench 128 which exposes the optically transparent wafer 110 and FIG. 4A illustrates that a spacer 130 is provided between two optical lens sets 120 and in a trench 128 which does not expose the optically transparent wafer 110.

Moreover, a curing step is carried out to cure the adhesive material 135 in the corresponding trench 128 to form an adhesive 136 after each spacer 130 is correctly placed in a corresponding trench 128. The curing step is intentionally carried out to make the adhesive material 135 accommodated inside the corresponding trench 128 properly cured become the adhesive 136 so as to construct a permanent fixation between all the spacers 130 and the optically transparent wafer 110.

A suitable curing treatment to cure the adhesive material 135 is dependent upon the type of the adhesive material 135 which fills the trench 128. A UV curable adhesive may be cured by a suitable UV light exposure condition in accordance with the UV curable adhesive material. A thermal curable adhesive may be cured by a suitable thermal treatment condition in accordance with the thermal curable adhesive material, and a pressure sensitive adhesive may be cured by a sufficiently pressure-applied condition in accordance with the PSA curable adhesive material. Please refer to the specifications of various adhesive materials for the correct curing treatment.

Figure 5:
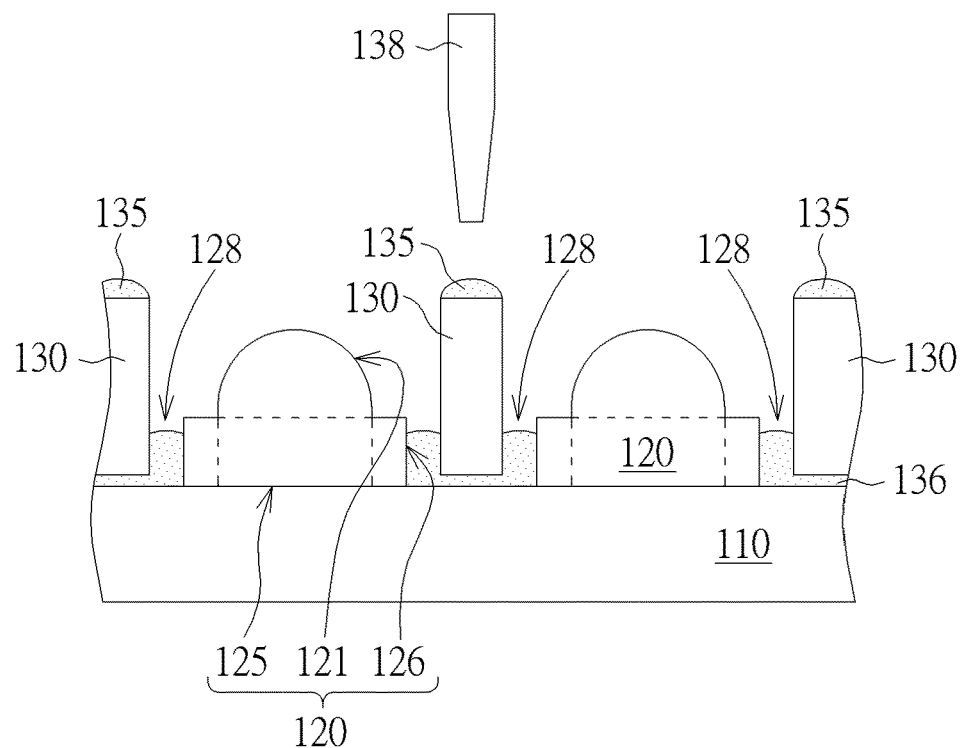
Figure 5A:
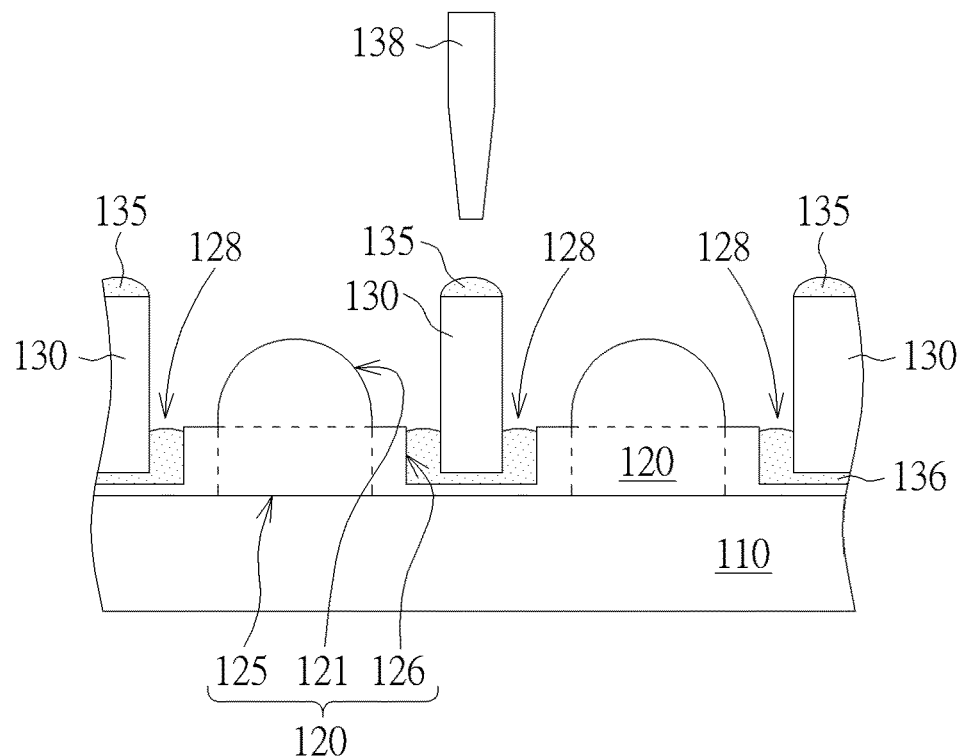
FIG. 5A illustrates that the adhesive material is dispensed on the top surface of each spacer and the trench does not expose the optically transparent wafer.

Subsequently, please refer to FIG. 5, another adhesive material 135 is dispensed on the top surface of each spacer 130. Optionally, this adhesive material 135 dispensed on the top surface of each spacer 130 may be the same adhesive material as the adhesive material 135 which fills the trench 128, or alternatively a different adhesive material. Generally speaking, the adhesive material 135 is properly dispensed so the adhesive material 135 is able to stably stay on the top surface of each spacer 130 without flowing away. FIG. 5 illustrates that the adhesive material 135 is dispensed on the top surface of each spacer 130 and the trench 128 exposes the optically transparent wafer 110 and FIG. 5A illustrates that the adhesive material 135 is dispensed on the top surface of each spacer 130 and the trench 128 does not expose the optically transparent wafer 110.

Figure 6:
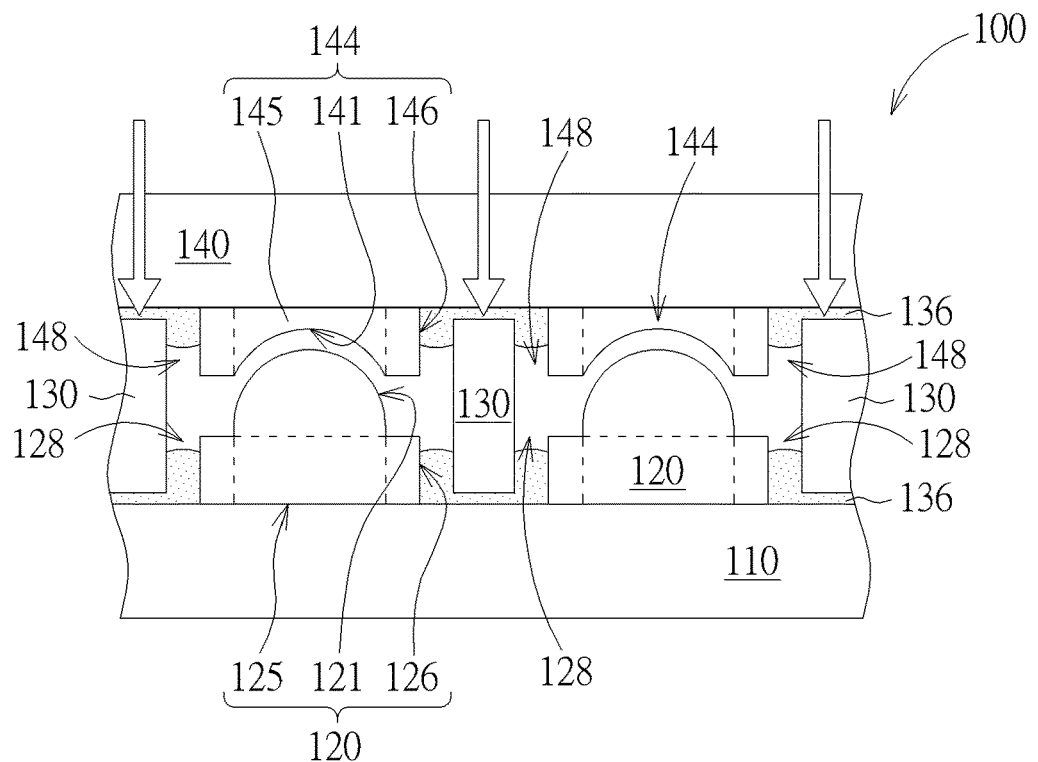

Afterwards, please refer to FIG. 6, first an optically transparent substrate 140 is used to cover the spacers 130 with uncured adhesive material 135, the optical lens sets 120, and the optically transparent wafer 110. The optically transparent substrate 140 may be like another optically transparent wafer 110 with multiple optical lens sets 120, or a cover glass to protect the topmost layer of the imaging optical lens sets 144 on the optically transparent substrate 140. In other words, there may be one or more optically transparent wafers 110 with multiple optical lens sets 120 to form stack layers of optical element layers. Both the spacers 130 and the optically transparent substrate 140 may be made of the same optically transparent material, such as glass or a silica material. Preferably speaking, the optically transparent material for the optically transparent substrate 140 may be glass with the coefficient of thermal expansion as small as possible.

Figure 6A:
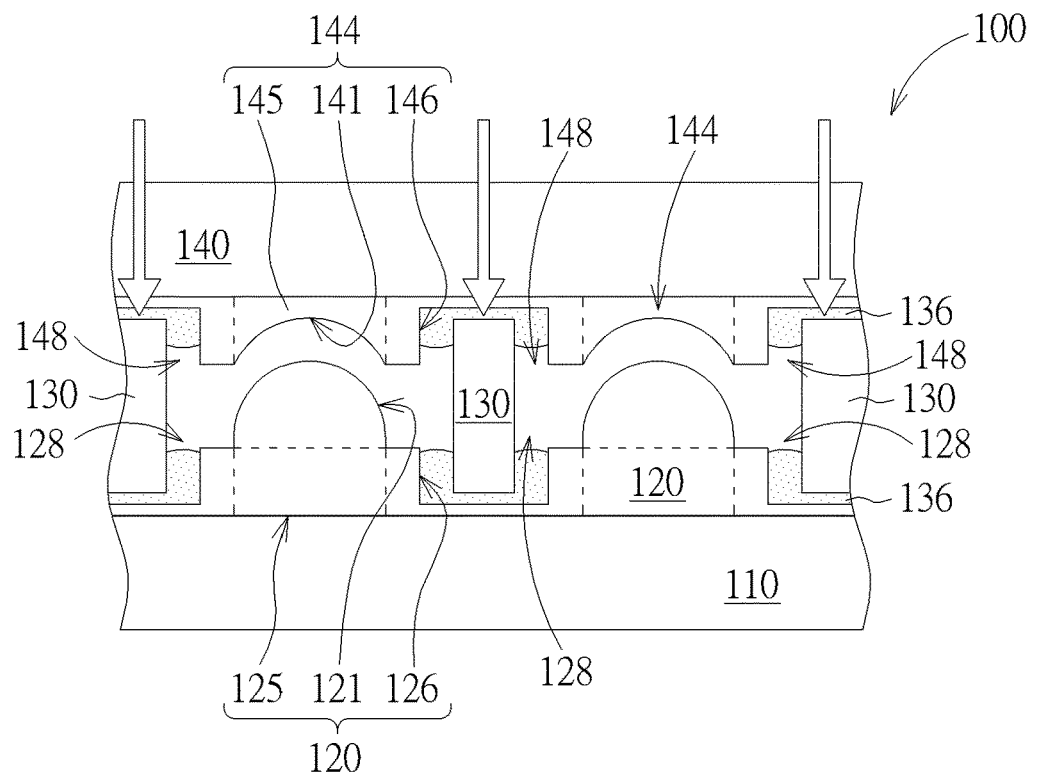
FIG. 6A illustrates that the optically transparent substrate covers the spacers and the trench does not expose the optically transparent wafer.
Figure 6B:
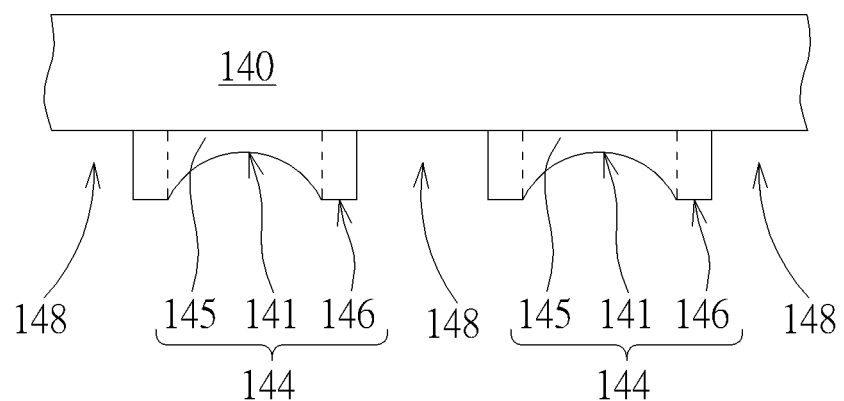
FIG. 6B illustrates an example of an optically transparent substrate.

For example, first an optically transparent substrate 140 is provided, as shown in FIG. 6B. There are multiple imaging optical lens sets 144, for example, at least two imaging optical lens sets 144 are formed to be disposed on the optically transparent substrate 140. A trench 148 is sandwiched between two adjacent individual imaging optical lens sets 144.

Each imaging optical lens set 144 includes one single lens 141 integrated with a residual layer 145, with or without an extending shoulder 146. The surface curvature of each imaging optical lens 141 may be either convex or concave. The imaging optical lens sets 144 respectively correspond to the optical lens sets 120. Please refer to the formation of the optical lens sets 120 for the details of the formation of the imaging optical lens sets 144.

FIG. 6 illustrates that the optically transparent substrate 140 covers the spacers 130 and the trench 128 exposes the optically transparent wafer 110 and FIG. 6A illustrates that the optically transparent substrate 140 covers the spacers 130 and the trench 128 does not expose the optically transparent wafer 110.

Second, the optically transparent substrate 140 is disposed on the spacers 130 and in direct contact with the uncured adhesive material 135. The optically transparent substrate 140 so far is still temporarily attached to the spacers 130.

Because the optically transparent substrate 140 is still temporarily attached to the spacers 130, in a following step another suitable curing step is carried out to cure the adhesive material 135 disposed between the spacers 130 and the optically transparent substrate 140 to form another adhesive 136, as shown in FIG. 6 or in FIG. 6A. Another suitable curing step, like the previous suitable curing treatment procedure, is used to cure the adhesive material 135. A suitable curing treatment to cure the adhesive material 135 is dependent upon the adhesive material 135, for example to cure a UV curable adhesive, a thermal curable adhesive or a pressure sensitive adhesive (PSA). Please refer to the specifications of various adhesive materials for the correct curing treatment.

Figure 7:
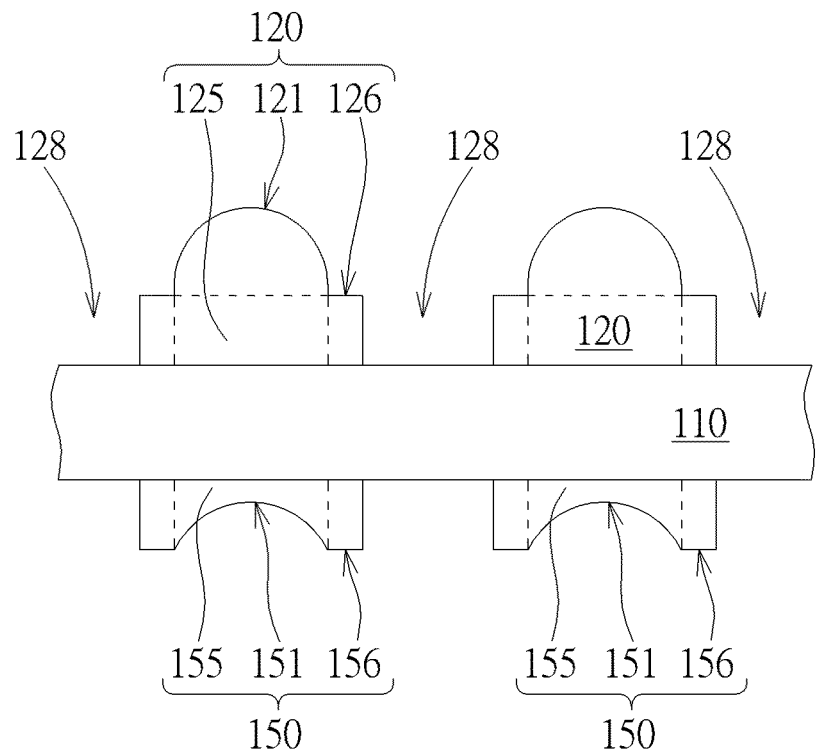
FIG. 7 illustrates that there are extending shoulders present and the trench exposes the optically transparent wafer.

Optionally, as shown in FIG. 7, there may be multiple bottom optical lens sets 150, for example, at least two bottom optical lens sets 150 disposed on the optically transparent wafer 110. The bottom optical lens sets 150 are located beneath the optical lens sets 120 and respectively correspond to the optical lens sets 120. In particular, the multiple bottom optical lens sets 150 well align with the optical lens sets 120 atop the multiple bottom optical lens sets 150. Each bottom optical lens set 150 includes one single lens 151 integrated with a residual layer 155, with or without an extending shoulder 156. The surface curvature of each lens 151 in the bottom optical lens sets may be either convex or concave.

Figure 7A:
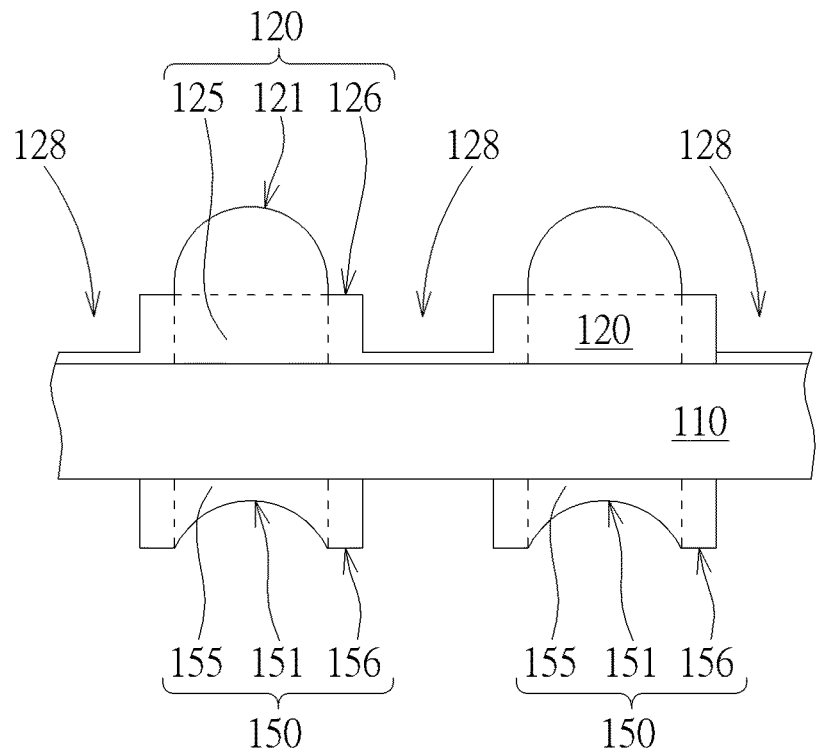
FIG. 7A illustrates that there are extending shoulders present and the trench does not expose the optically transparent wafer.

The multiple bottom optical lens sets 150 may be formed along with the formation of the optical lens sets 120 or prior to the spacers 130 glued to the optically transparent wafer 110. FIG. 7 illustrates that there are extending shoulders 126 and 156 present and the trench 128 exposes the optically transparent wafer 110, and FIG. 7A illustrates that there are extending shoulders 126 and 156 present and the trench 128 does not expose the optically transparent wafer 110. Please refer to the formation of the optical lens sets 120 for the details of the formation of the bottom optical lens sets 150. Please also refer to the optical lens sets 120 for the details of the imaging optical lens sets 144 and the bottom optical lens sets 150.

Because the optically transparent wafer 110 has the trenches 128 to accommodate a soft, liquid-like adhesive material 135, the adhesive material 135 does not over-flow easily, i.e. the undesirable over-glue issue may be efficiently prevented when the soft, liquid-like adhesive material 135 makes the trench 128 approximately half-filled.

Figure 8:
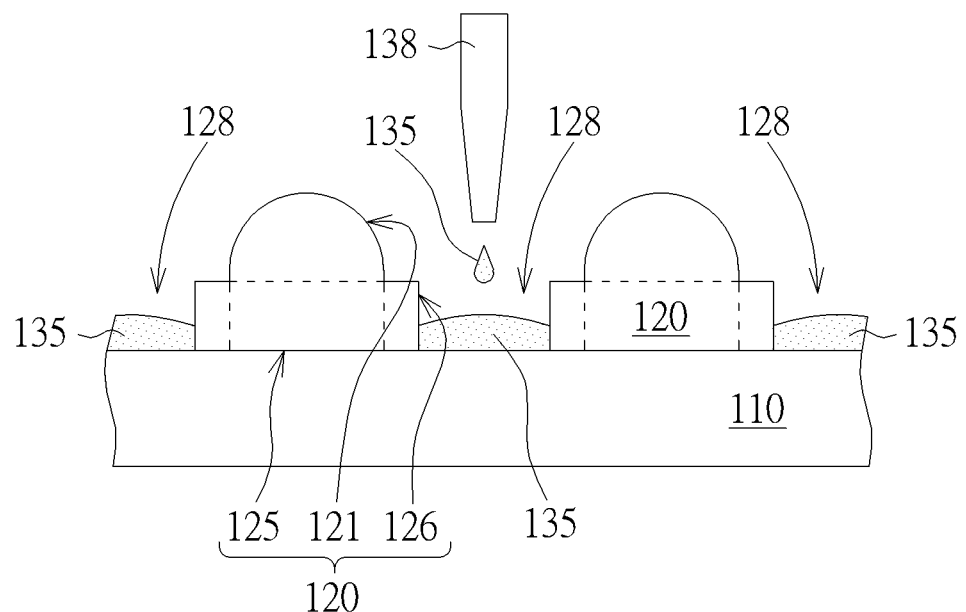
FIG. 8, FIG. 9 and FIG. 10 illustrate a second example of a novel method to form a wafer-level optical structure of the present invention.
Figure 9:
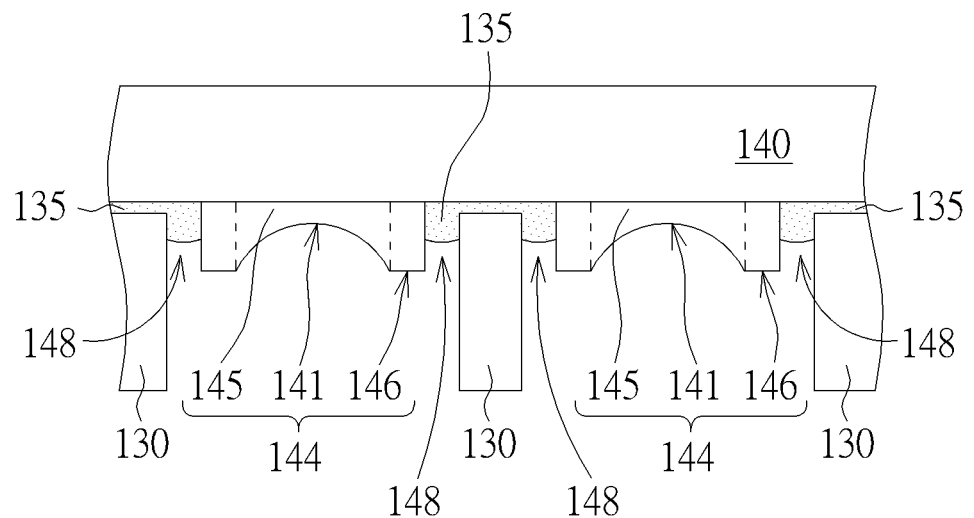
Figure 10:
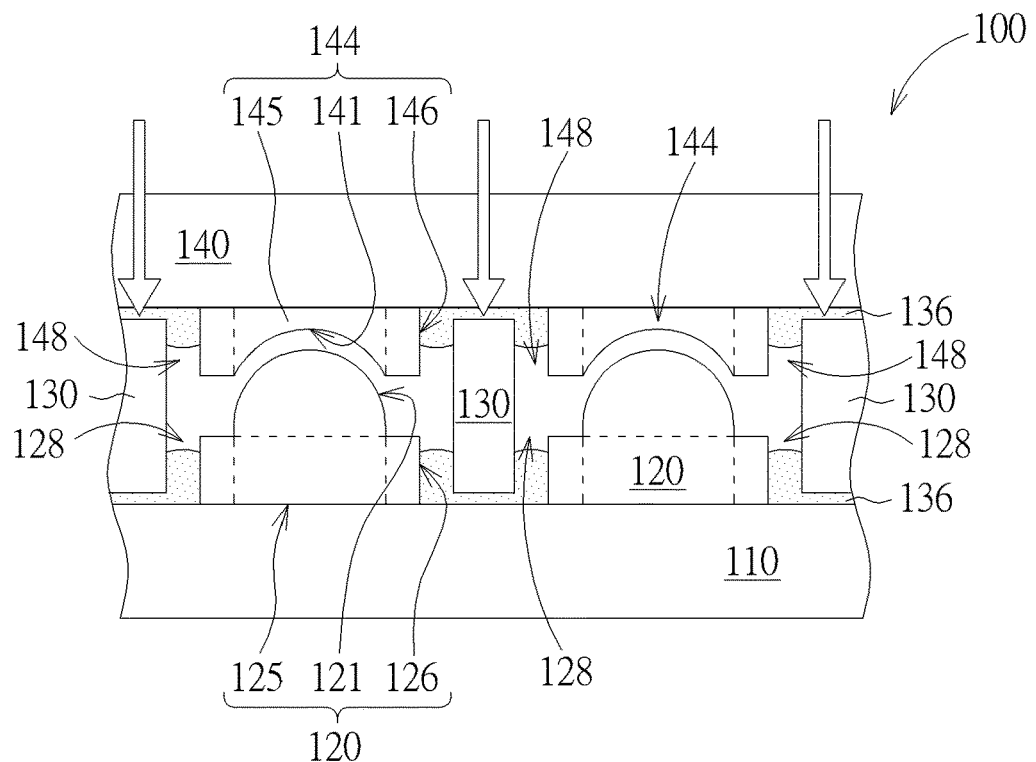

The present invention in a second aspect provides another novel method to forma wafer-level optical structure to overcome the above problems in prior art. FIG. 8 to FIG. 10 illustrate a second example of a novel method to form a wafer-level optical structure of the present invention. Please refer to FIG. 8. First, an optically transparent wafer 110 is provided. The optically transparent wafer 110 may be a glass wafer made of optically transparent material, such as glass or a silica material.

There are multiple optical lens sets 120 disposed on the optically transparent wafer 110. For example, there are at least two optical lens 120 sets disposed on and in direct contact with the optically transparent wafer 110. Preferably speaking, there are multiple optical lens sets 120 to form an array disposed on the optically transparent wafer 110.

Each optical lens set 120 includes one single lens 121 integrated with a residual layer 125, with or without an extending shoulder 126. The lenses 121 and the residual layer 125 are made of the same optically transparent polymeric material to serve as the optical lens sets 120. The surface curvature of each optical lens 121 may be either convex or concave.

Preferably speaking, the polymeric material may be an acrylate-type material or a methacrylate-type material. The lenses 121 and the residual layer 125 are integrally formed or one-piece formed so the lenses 121 and the residual layer 125 are integrated with one another and not separable. For example, the lenses 121 and the residual layer 125 may be formed by the polymerization of monomers or oligomers of an acrylate-type material or a methacrylate-type material in the presence of a template (not shown) to facilitate the formation of the surface curvature of each lens 121.

Each of the optical lens sets 120 further includes an extending shoulder 126 to surround the residual layer 125. The extending shoulder 126 is not in contact with another extending shoulder 126 of an adjacent optical lens set 120 because of a trench 128. In other words, a trench 128 is sandwiched between two adjacent individual optical lens sets 120.

Figure 8A:
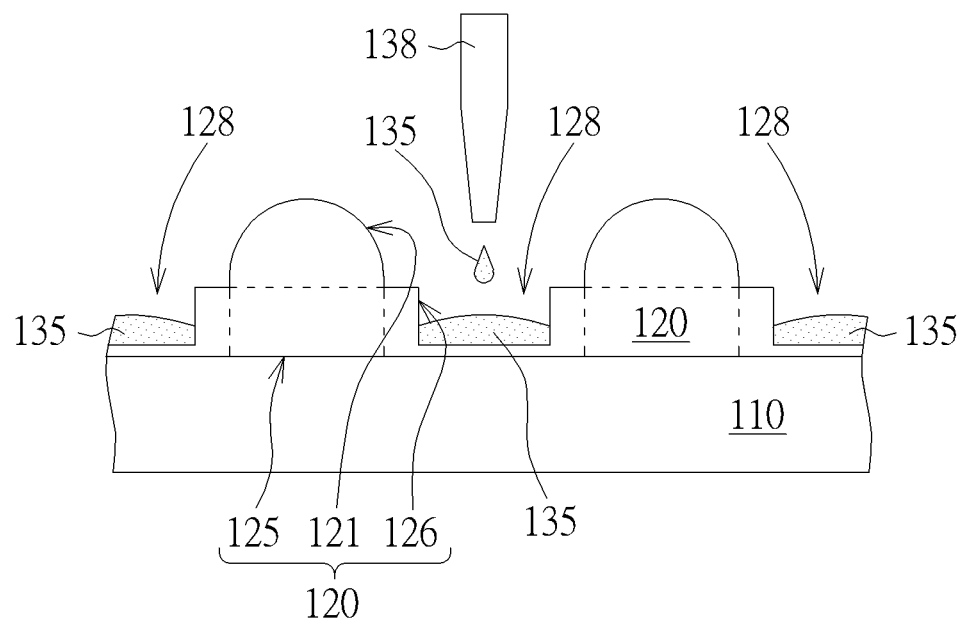
FIG. 8A illustrates that there is no shoulder in each optical lens set.

For example, the residual layer 125 in each optical lens set 120 is wider than the lens 121 atop it, and the wider region of the residual layer 125 in each optical lens set 120 serves as the extending shoulder 126 of the optical lens set 120. A wider shoulder 126 makes the trench 128 narrower so multiple trenches 128 may have variable width or different width. Or alternatively, as shown in FIG. 8A, there is no shoulder in each optical lens set 120. Please refer to the above descriptions, for example FIG. 2D, for the details of the optical lens sets 120 and the optically transparent wafer 110.

Moreover, each trench 128 is filled with an adhesive material 135. The adhesive material 135 is usually a soft or a liquid-like glue. For example, the adhesive material 135 may be a curable adhesive and selected from a group consisting of a UV curable adhesive, a thermal curable adhesive and a pressure sensitive adhesive (PSA). A UV curable adhesive may be cured by a suitable UV light exposure condition. A thermal curable adhesive may be cured by a suitable thermal treatment condition, and a pressure sensitive adhesive may be cured by a sufficiently pressure-applied condition. In FIG. 8 or in FIG. 8A, the soft, liquid-like adhesive material 135 is illustrated to be dispensed by a dispenser 138.

Because each trench 128 is defined by the adjacent individual optical lens sets 120, the soft, liquid-like adhesive material 135 is well accommodated inside the trench 128 and does not over-flow, i.e. over-glue, when the soft, liquid-like adhesive material 135 is dispensed to partially fill the trench 128. Preferably speaking, the soft, liquid-like adhesive material 135 may be applied to make the trench 128 approximately half-filled to more efficiently prevent the undesirable over-flow problem or over-glue issue. FIG. 8 illustrates that the optically transparent wafer 110 underlying the trench 128 is exposed in the presence of the shoulder 126, and FIG. 8A illustrates that the optically transparent wafer 110 underlying the trench 128 is exposed in the absence of the shoulder 126.

Second, please refer to FIG. 9, an optically transparent substrate 140 is provided. There are multiple spacers 130, for example, there are at least three spacers 130 and at least two imaging optical lens sets 144 which are disposed on the optically transparent substrate 140. The optically transparent substrate 140 may be like another optically transparent wafer 110 with multiple optical lens sets 120, or a cover glass to protect the topmost layer of the imaging optical lens sets 144 disposed on the optically transparent substrate 140. In other words, there may be one or more optically transparent wafers 110 with multiple optical lens sets 120 to form stack layers of optical element layers. Preferably speaking, both the spacers 130 and the optically transparent substrate 140 are made of the same optically transparent material, such as glass or a silica material.

Figure 9A:
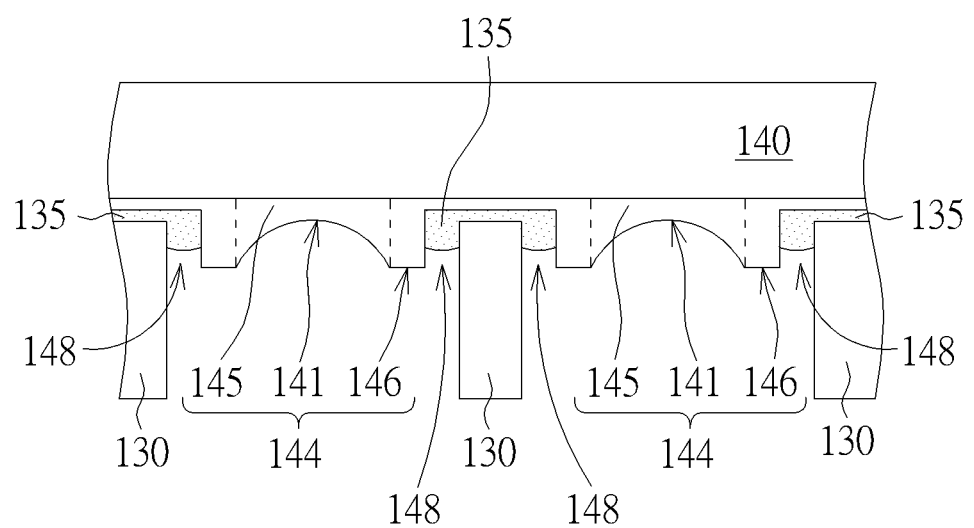
FIG. 9A illustrates that the trench does not expose the optically transparent substrate.

Each imaging optical lens set 144 includes one single lens 141 integrated with a residual layer 145, and the residual layer 145 may be with or without an extending shoulder 146. The surface curvature of each imaging optical lens 144 may be either convex or concave. The imaging optical lens sets 144 respectively correspond to the optical lens sets 120. Please refer to the formation of the optical lens sets 120 for the details of the formation of the imaging optical lens sets 144. FIG. 9 illustrates that the trench 148 exposes the optically transparent substrate 140, and FIG. 9A illustrates that the trench 148 does not expose the optically transparent substrate 140.

Figure 10A:
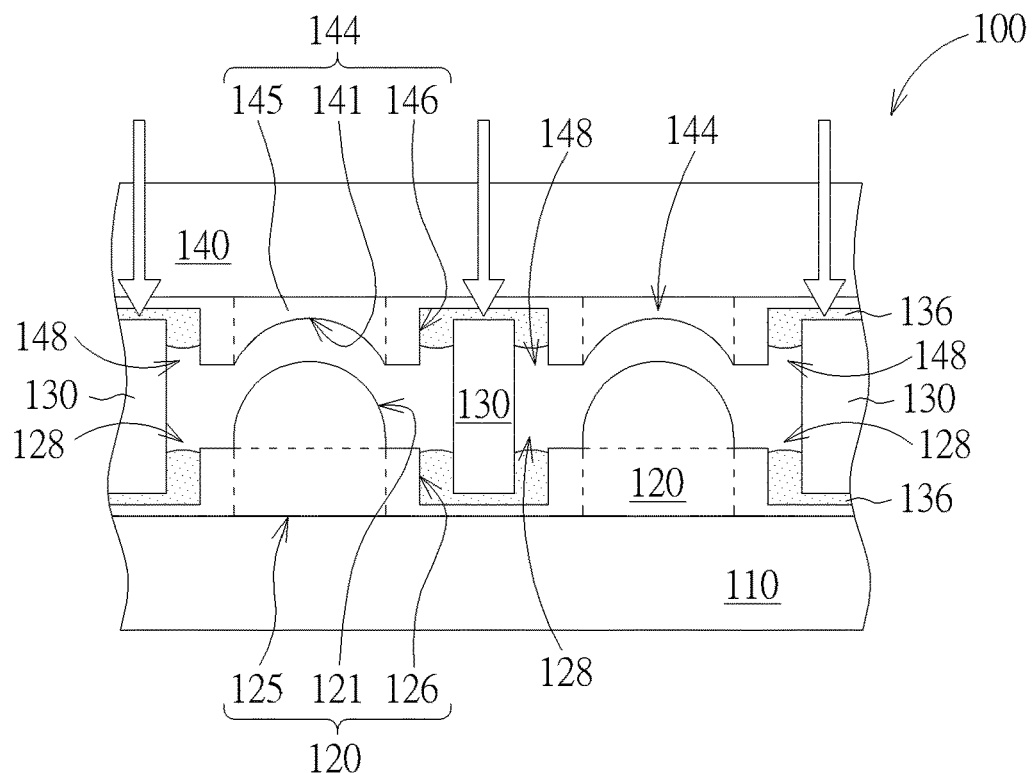
FIG. 10A illustrates that there are extending shoulders and the trench does not expose the optically transparent wafer.

Next, the optically transparent substrate 140 is combined with the optically transparent wafer 120 so that the adhesive material 135 on the optically transparent wafer 120 is in direct with the spacers 130. Further, each spacer 130 is partially placed in the trench 128. In other words, one spacer 130 is disposed between two adjacent optical lens sets 120 to segregate two adjacent optical lens sets. FIG. 10 illustrates that there are extending shoulders 126 and 146 and the trench 128 exposes the optically transparent wafer 110, and FIG. 10A illustrates that there are extending shoulders 126 and 146 and the trench 128 does not expose the optically transparent wafer 110.

Moreover, please refer to FIG. 10, a curing step is needed to cure the adhesive material 135 in the corresponding trench 128 to form an adhesive 136 after each spacer 130 is placed in a corresponding trench 128. The curing step is intentionally carried out to make the adhesive material 135 accommodated inside the corresponding trench 128 properly cured to become the adhesive 136 so as to form a permanent fixation between all the spacers 130 and the optically transparent wafer 110. Optionally, the curing step may also simultaneously make the possible adhesive material 135 disposed between the spacers 130 and the optically transparent substrate 140 properly cured to become the adhesive 136 so as to form a permanent fixation between all the spacers 130 and the optically transparent substrate 140.

A suitable curing treatment to cure the adhesive material 135 is dependent upon the adhesive material 135. A UV curable adhesive may be cured by a suitable UV light exposure condition in accordance with the UV curable adhesive material. A thermal curable adhesive may be cured by a suitable thermal treatment condition in accordance with the thermal curable adhesive material, and a pressure sensitive adhesive may be cured by a sufficiently pressure-applied condition in accordance with the PSA curable adhesive material. Please refer to the specifications of various adhesive materials for the correct curing treatment.

Optionally, as shown in FIG. 7, there may be multiple bottom optical lens sets 150, for example, at least two bottom optical lens sets 150 disposed on the optically transparent wafer 110. The bottom optical lens sets 150 are located beneath the optical lens sets 120 and respectively correspond to the optical lens sets 120. In particular, multiple bottom optical lens sets 150 well align with the optical lens sets 120 atop the multiple bottom optical lens sets 150. Each bottom optical lens set 150 includes one single lens 151 integrated with the residual layer 155, with or without an extending shoulder 156. The surface curvature of each lens 151 in the bottom optical lens sets 150 may be either convex or concave.

The multiple bottom optical lens sets 150 may be formed along with the formation of the optical lens sets 120 or prior to the spacers 130 glued to the optically transparent wafer 110. Please refer to the formation of the optical lens sets 120 for the details of the formation of the bottom optical lens sets 150. Please also refer to the optical lens sets 120 for the details of the imaging optical lens sets 144 and the bottom optical lens sets 150.

Because the optically transparent wafer 110 has the trenches 128 to accommodate a soft, liquid-like adhesive material 135, the adhesive material 135 does not over-flow easily, i.e. the undesirable over-glue issue may be more efficiently prevented when the soft, liquid-like adhesive material 135 makes the trench 128 approximately half-filled.

After the above methods to form a wafer-level optical structure, a wafer-level optical structure is resultantly obtained. Accordingly, the present invention in a third aspect provides a novel wafer-level optical structure to be free of the over-flow problem or free of the over-glue issue in order to overcome the problems in prior art.

FIG. 6, FIG. 6A, FIG. 10 and FIG. 10A respectively illustrate an example of a novel wafer-level optical structure of the present invention. The wafer-level optical structure 100 of the present invention at least includes an optically transparent wafer 110, multiple optical lens sets 120, and multiple spacers 130. In one embodiment of the wafer-level optical structure 100 of the present invention, the optically transparent wafer 110 is flat glass.

There may be an optically transparent substrate 140 which covers the spacers 130, the optical lens sets 120, and the optically transparent wafer 110. There are multiple optical lens sets 120 disposed on the optically transparent wafer 110, for example, there are at least two optical lens sets 120 disposed on the optically transparent wafer 110. In particular, each one of the optical lens sets 120 includes a lens 121 atop and integrated with a residual layer 125 to form an "omega (Ω)" shape if an extending shoulder 126 is present or to form a bullet shape if an extending shoulder is absent. The surface curvature of each lens 121 may be either convex or concave.

Similarly, there may be multiple imaging optical lens sets 144 which are disposed on the optically transparent substrate 140 and respectively correspond to the optical lens sets 120. In particular, each one of the imaging optical lens sets 144 includes a lens 141 atop and integrated with a residual layer 145 as well to form an "omega (Ω)" shape if an extending shoulder 146 is present or to forma bullet shape if an extending shoulder is absent. The surface curvature of a lens 141 in an imaging optical lens set 141 may be either convex or concave and each residual layer 145 in an imaging optical lens set 144 may have an extending shoulder 146 or no extending shoulder.

The optically transparent wafer 110, the spacers 130 and the optically transparent substrate 140 may be made of an optically transparent material, such as glass or a silica material. For example, the optically transparent material may be glass with the coefficient of thermal expansion as small as possible. Preferably speaking, the optically transparent wafer 110, the spacers 130 and the optically transparent substrate 140 may be made of the same optically transparent material.

In one embodiment of the present invention, the optional optically transparent substrate 140 may be like another optically transparent wafer 110 with multiple optical lens sets 120, or a cover glass to protect the optical lens sets 120 on the topmost layer of the optically transparent wafer 110. In other words, there may be one or more optically transparent wafers 110 with multiple optical lens sets 120 to form stack layers of optical element layers.

Further, there are multiple trenches 128 disposed between the optical lens sets 120. Each trench 128 may be considered to be defined by two adjacent individual optical lens set 120. For example, each trench 128 is sandwiched between two adjacent individual optical lens set 120 to segregate the two adjacent optical lens sets 120. Moreover, the trench 128 may be deep enough to expose the underlying optically transparent wafer 110. In particular, a wider shoulder 126 of an optical lens set 120 makes the trench 128 narrower so multiple trenches 128 may have variable width or different width.

There are multiple spacers 130 disposed on the optically transparent wafer 110, and each spacer 130 is disposed between the optically transparent wafer 130 and the optically transparent substrate 140. In particular, each spacer 130 is disposed between two adjacent optical lens sets 120 and partially inside a corresponding trench 128 to segregate the two isolated and adjacent optical lens sets 120 but any extending shoulder 126 is not in direct contact with an adjacent spacer 130.

In one embodiment of the present invention, the spacers 130 are fixed to the optically transparent wafer 110 because of the adhesive 136. Similarly, the spacers 130 are fixed to the optically transparent substrate 140 because of the adhesive 136.

The size of the spacer 130 is dependent upon the sizes of the optical lens set 120 and of the trench 128. Please refer to FIG. 2D for the detailed descriptions of the sizes of the elements.

Optionally, as shown in FIG. 7, there may be multiple bottom optical lens sets 150, for example, at least two bottom optical lens sets 150 disposed on the optically transparent wafer 110. The bottom optical lens sets 150 are located beneath the optical lens sets 120 and respectively correspond to the optical lens sets 120. In particular, the multiple bottom optical lens sets 150 well align with the optical lens sets 120 atop the multiple bottom optical lens sets 150. Each bottom optical lens set 150 includes one single lens 151 integrated with the residual layer 155, with or without an extending shoulder 156. The surface curvature of each lens 151 in the bottom optical lens sets 150 may be either convex or concave.

The multiple bottom optical lens sets 150 may be formed along with the formation of the optical lens sets 120 or prior to the spacers 130 glued to the optically transparent wafer 110. Please also refer to the optical lens sets 120 for the details of the imaging optical lens sets 144 and the bottom optical lens sets 150.

The wafer-level optical structure 100 of the present invention has the trenches 128 to accommodate the adhesive 136, the wafer-level optical structure 100 shows no over-flow problem or no over-glue issue and eliminates undesirable bow distortion of the optically transparent wafer along with the polymeric layer and undesirable misalignment of stack layers to exhibit better product quality, interlayer alignment accuracy and optical performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer-level optical structure, comprising:
   an optically transparent wafer;
   at least two optical lens sets disposed on said optically transparent wafer, wherein each of said at least two optical lens sets comprising a lens integrated with a residual layer;
   at least one trench disposed above said optically transparent wafer, wherein said at least one trenches is disposed between two adjacent said at least two optical lens sets to divide adjacent said at least two optical lens sets;
   at least one spacer disposed on said optically transparent wafer, wherein said at least one spacer is disposed between adjacent said at least two optical lens sets to be correspondingly and partially disposed in one of said at least one trench; and
   an adhesive disposed inside one of said at least one trench to at least partially fill the trench and in direct contact with one of said at least one spacer.

2. The wafer-level optical structure of claim 1, wherein each one of said at least two optical lens sets further comprises an extending shoulder and said extending shoulder is not in contact with adjacent said at least one spacer.

3. The wafer-level optical structure of claim 2, wherein two of adjacent said extending shoulders define one of said at least one trench.

4. The wafer-level optical structure of claim 2, wherein said adhesive is in direct contact with said extending shoulder.

5. The wafer-level optical structure of claim 1, wherein said adhesive is in direct contact with said optically transparent wafer.

6. The wafer-level optical structure of claim 1, further comprising:
   a plurality of said trenches and said trenches having variable width.

7. The wafer-level optical structure of claim 1, further comprising:
   an optically transparent substrate disposed on said at least one spacer.

8. The wafer-level optical structure of claim 7, wherein said optically transparent substrate is attached to said at least one spacer with the help of said adhesive.

9. The wafer-level optical structure of claim 7, further comprising:
   at least two imaging optical lens sets disposed on said optically transparent substrate and respectively corresponding to said at least two optical lens sets.

10. The wafer-level optical structure of claim 1, further comprising:
    at least two bottom optical lens sets disposed on said optically transparent wafer, located beneath said at least two optical lens sets and respectively corresponding to said at least two optical lens sets.

* * * * *